United States Patent
Boardman et al.

(10) Patent No.: US 7,105,925 B2
(45) Date of Patent: Sep. 12, 2006

(54) DIFFERENTIAL PLANARIZATION

(75) Inventors: James A. Boardman, Hillsboro, OR (US); Sarah E. Kim, Portland, OR (US); Paul B. Fischer, Portland, OR (US); Mauro J. Kobrinsky, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/055,453

(22) Filed: Feb. 2, 2005

(65) Prior Publication Data

US 2005/0170759 A1    Aug. 4, 2005

Related U.S. Application Data

(62) Division of application No. 10/334,308, filed on Dec. 28, 2002, now Pat. No. 6,914,002.

(51) Int. Cl.
*H01L 23/48* (2006.01)
*H01L 23/52* (2006.01)
*H01L 29/49* (2006.01)

(52) U.S. Cl. ............... 257/752; 257/686; 257/690; 257/620; 257/621; 257/758; 257/E21.583; 257/E21.58

(58) Field of Classification Search ........ 257/752–758, 257/686–690, 620, 621, E21.583
See application file for complete search history.

(56) References Cited

U.S. PATENT DOCUMENTS

| 5,721,172 | A * | 2/1998 | Jang et al. ................ 438/424 |
|---|---|---|---|
| 6,194,313 | B1 * | 2/2001 | Singh et al. ............... 438/675 |
| 6,232,231 | B1 * | 5/2001 | Sethuraman et al. ........ 438/691 |
| 6,281,114 | B1 | 8/2001 | Lin et al. |
| 6,355,147 | B1 * | 3/2002 | Griffiths et al. ............ 204/242 |
| 6,375,694 | B1 | 4/2002 | Roberts et al. |
| 6,391,768 | B1 * | 5/2002 | Lee et al. ................... 438/633 |
| 6,492,274 | B1 | 12/2002 | Pryor |
| 6,815,354 | B1 * | 11/2004 | Uzoh et al. ................ 438/692 |
| 6,870,270 | B1 * | 3/2005 | Kobrinsky et al. ......... 257/777 |
| 2001/0055870 | A1 * | 12/2001 | Tsutsui ....................... 438/600 |
| 2003/0211815 | A1 | 11/2003 | Carter et al. |
| 2003/0219982 | A1 | 11/2003 | Kurata et al. |

OTHER PUBLICATIONS

International Search Report PCT/US 03/39192.

* cited by examiner

*Primary Examiner*—B. William Baumeister
*Assistant Examiner*—Igwe U. Anya
(74) *Attorney, Agent, or Firm*—Michael D. Plimier

(57) ABSTRACT

Method and structure for optimizing and controlling chemical mechanical planarization are disclosed. Embodiments of the invention include planarization techniques to make non-planar surfaces comprising alternating metal and intermetal layers. Relative protrusion dimensions and uniformity of various layers may be accurately controlled using the disclosed techniques.

9 Claims, 5 Drawing Sheets

DIFFERENTIAL PLANARIZATION

This is a Divisional application of Ser. No. 10/334,308 filed Dec. 28, 2002, which is presently pending.

BACKGROUND OF THE INVENTION

Microelectronic structures, such as interconnect or metallization layers, may be manufactured by depositing consecutive layers of materials on a substrate. Depending upon the fabrication techniques and materials, one or more of these consecutive layers may form a nonplanar surface having uneven topography. It may be desirable to planarize nonplanar topographies in preparation for subsequent depositions or operations. Most commonly, planarization techniques such as chemical mechanical planarization ("CMP") are utilized to produce a substantially planar surface across adjacent exposed materials, such as alternating metallized interconnect layers and interlayer dielectric layers.

In some manufacturing scenarios, it is desirable to obtain nonplanar topographies having controlled tolerances for relative protrusion of various materials. For example, to utilize diffusional creep as a facilitating factor for conductive layer interfacing purposes as described in a co-filed and co-assigned U.S. patent application for the invention entitled "Method and Structure for Interfacing Electronic Devices", it is desirable to manufacture structures wherein a series of metal layers extends, or protrudes, away from the surrounding substrate material, as in the structure depicted in FIG. 2B, which is discussed in further detail below. To form such a configuration, a technique for selectively removing substrate material is useful. Such a method may comprise removing substrate material at a significantly greater rate than that at which metal layer material is removed, or it may comprise removing substrate material without removing substantially any of the metal layer material. The selectivity of conventional etchants to certain groups of materials as opposed to other groups provides the opportunity for selective etching where materials are appropriately paired. For example, conventional wet etchants may be utilized to selectively etch a silicon dioxide substrate at a faster rate than that at which adjacent copper metal layers are etched. Conventional patterning techniques may also be utilized to facilitate selective etching of substrate materials between metal layers, using anisotropic plasma etch chemistries and techniques, for example. These methods generally add complexity to structure processing, and may be somewhat imprecise. Further, in the event that a required surface is to have more than one level of topography, such as a surface wherein certain groups of metallized layers are to protrude farther from the adjacent substrate material than are other metallized layers within the same surface, in effect requiring several different echelons of substrate height relative to the height of metallized layers, current processes are nonideal.

There is a need for a relatively streamlined process to manufacture structures wherein the protrusion height of metal layers relative to intermetal substrate layers may be controllably adjusted. Further, there is a need for a process to controllably form surfaces having multiple tiers or echelons of topography.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
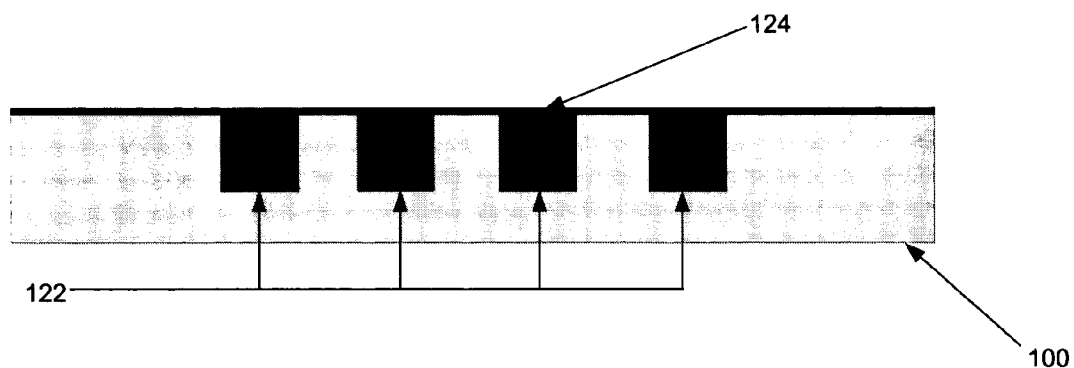
FIG. 1A depicts a cross-sectional view of a substrate layer having a metal layer electroplated into trenches formed in the substrate layer.

Referring to FIG. 1A, a substrate layer (100) is depicted having a series of trenches (122) into which a metal layer (124) has been formed. Structures such as that depicted in FIG. 1A are commonly seen in semiconductor processing, and the substrate layer and metal layer may comprise a wide variety of materials. For example, in the case of a device interconnect, the metal layer may comprise a metal such as copper, aluminum, tungsten, titanium, gold, nickel, indium, palladium, tin, and alloys thereof, formed using known techniques such as electroplating or chemical or physical vapor deposition.

The substrate layer may comprise a ceramic or polymer dielectric material, barrier materials, etch stop materials, or almost any nonmetal material used in a microelectronic device adjacent a metal layer. For example, the substrate may comprise silicon dioxide; silicon nitride; silicon oxynitride; carbon doped oxides; organic polymers such as polyimides, parylene, polyarylethers, organosilicates, polynaphthalenes, polyquinolines, and copolymers thereof. Examples of other types of materials that may be used to form the substrate layer (100) include aerogel, xerogel, and spin-on-glass ("SOG"). In addition, the substrate layer (100) may comprise hydrogen silsesquioxane ("HSQ") or methyl silsesquioxane ("MSQ"), which may be coated onto the surface of a semiconductor wafer using a conventional spin coating process. Although spin coating may be a preferred way to form the substrate layer (100) for some materials, for others chemical vapor deposition, plasma enhanced chemical vapor deposition, a SolGel process, or foaming techniques may be preferred. Other suitable substrate layer (100) materials, such as those known as "zeolites", have naturally occurring interconnected pores. While the term "zeolite" has been used in reference to many highly-ordered mesoporous materials, several zeolites are known as dielectric materials, such as mesoporous silica and aluminosilicate zeolite materials. Zeolite materials may be synthesized by an aerogel or xerogel process, spin-coated into place, or deposited using chemical vapor deposition to form a voided structure upon deposition. In the case of spin coating or other deposition methods, solvent may need to be removed using evaporative techniques familiar to those skilled in the art.

The substrate layer (100) may comprise several materials or several sublayers, as in the case of a conventional interconnect structure having copper metallization (124) wherein a barrier layer, comprising a material such as tantalum, tantalum nitride, titanium nitride, and tungsten or other materials that can inhibit diffusion from conductive materials such as copper into adjacent dielectric layers, is positioned between the copper material and the interlayer dielectric material. Known polymeric barrier layers having adequate electromigration and diffusion barrier characteristics may also be used as barrier layers. Many of the aforementioned dielectric materials are conventionally utilized as interlayer dielectrics adjacent barrier layers.

Figure 1B:
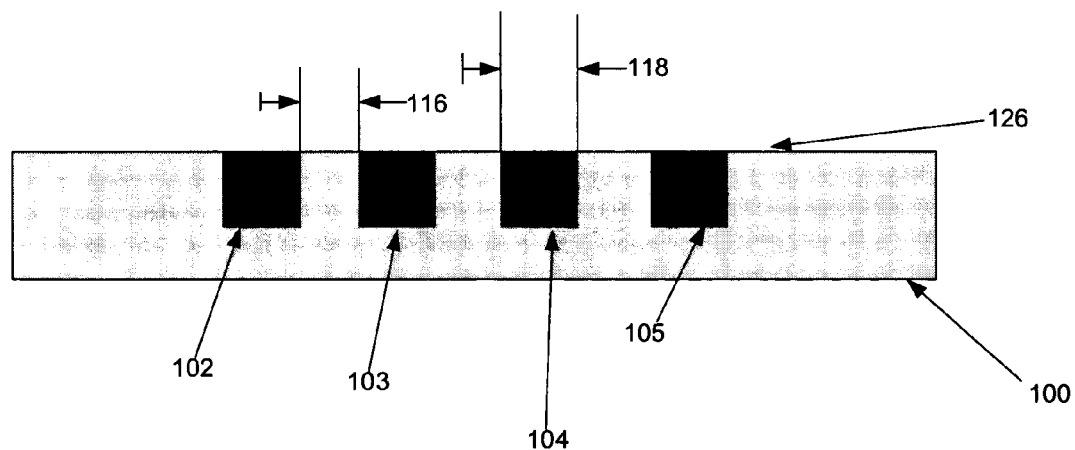
FIG. 1B depicts a cross-sectional view of a microelectronic structure having a substantially planar surface formed across a substrate layer which is coupled to a series of metal layers.

Referring to FIG. 1B, a structure similar to that of FIG. 1A is depicted, with the exception that the top surface has been planarized, preferably using chemical mechanical planarization, to form a substantially planar surface (126) comprising the planarized surface of the substrate layer (100) and exposed planarized surfaces of discrete metal layers (102–105). Conventional alumina-based slurries are commonly used for such applications. A CMP treatment to achieve a highly planar surface may comprise several polishing phases with slurries of varying material selectivity and abrasive particle size, as would be apparent to one skilled in the art. In the depicted embodiment, each of the metal layers has a substantially equivalent metal layer width (118) and is separated from other metal layers by a substantially equivalent intermetal gap (116). A key aspect of the structure depicted in FIG. 2A is the intermetal gap (116) distance, which in this case is equal for each of the metal layers (102–105).

Figure 2A:
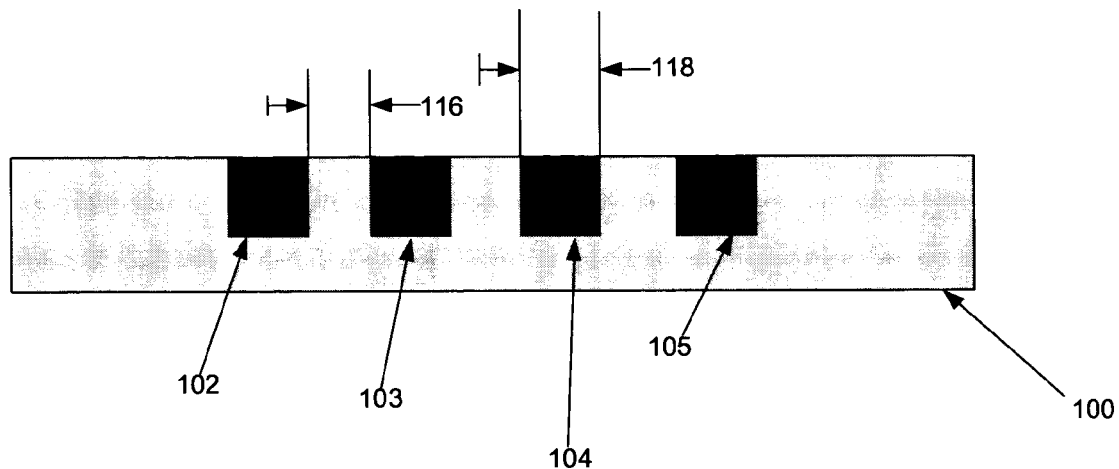
FIG. 2A depicts a cross-sectional view of a microelectronic structure having a substantially planar surface formed across a substrate layer which is coupled to a series of metal layers.
Figure 2B:
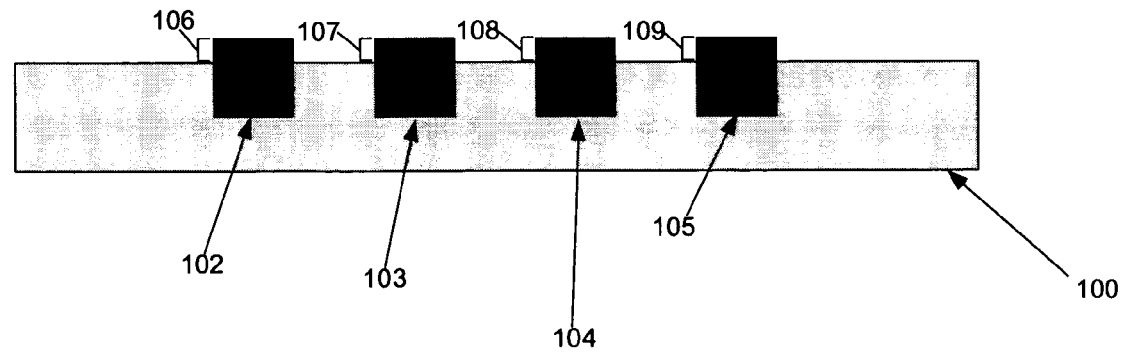
FIG. 2B depicts a cross-sectional view of various aspects of one embodiment of the present invention wherein differential planarization is utilized to form a nonplanar surface.
Figure 2C:
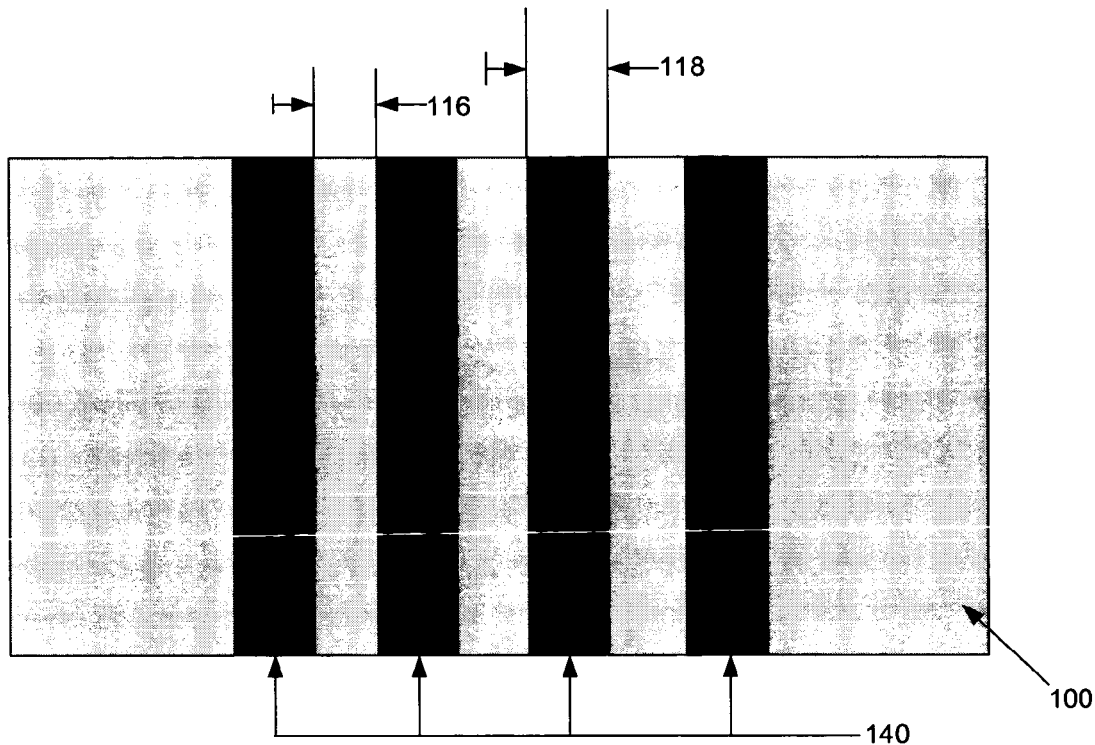
FIGS. 2C and 2D depict orthogonal views of two embodiments of the present invention wherein differential planarization is utilized to form nonplanar surfaces.
Figure 2D:
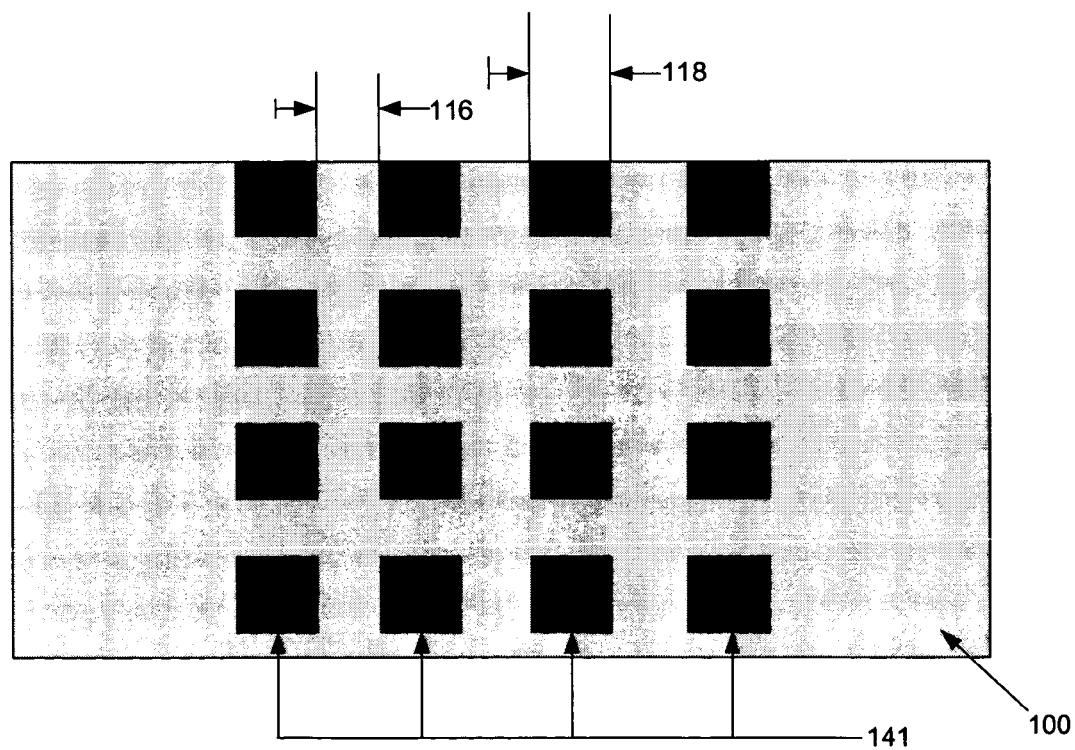

Referring to FIG. 2A, a structure similar to that of FIG. 1B is depicted. In the depicted embodiment, the substrate comprises silicon dioxide and the metal layers (102–105) comprise copper. A thin barrier layer (not shown) of, for example, tantalum or tantalum nitride may be positioned between the copper metal lines and the silicon dioxide substrate. Referring to FIG. 2B, a structure similar to that of FIG. 2A is depicted, with the exception that the level of the substrate layer relative to the metal layers has been decreased. As shown in FIG. 2B, each of the metal layers (102–105) extends, or protrudes, from the substrate layer by a protrusion height (106–109). In the depicted embodiment, each of the protrusion heights is substantially equal due to the fact that each of the intermetal gap distances (116) of the structure of FIG. 2A were substantially equivalent. Forming the structure of FIG. 2B from that of FIG. 2A preferably utilizes a specialized chemical mechanical planarization (CMP) technique which may be referred to as "differential planarization". Differential planarization may be applied to modify the protrusion heights of contracts which are linear or continuous (140) in nature, as in the orthogonal view of FIG. 2C, contacts which are discrete (141), as in the orthogonal view of FIG. 2D, or combinations of both discrete and linear geometries in a given microelectronic structure. The cross-sectional view of FIG. 2B, for example, is representative of a cross section of either of the structures depicted in FIG. 2C, or those depicted in FIG. 2D.

Figure 4:
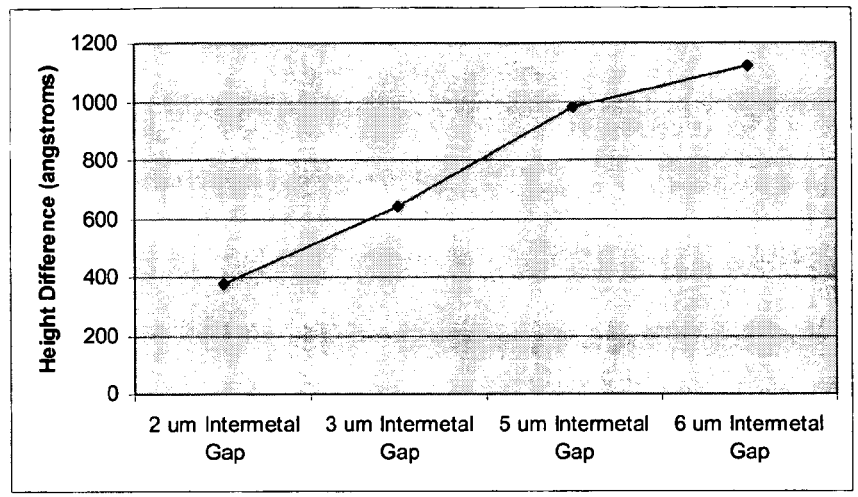
FIG. 4 depicts a chart illustrating metal layer height difference versus intermetal gap spacing in accordance with one embodiment of the present invention.

Differential planarization is a process in which materials selection and relative positioning, CMP slurry selection, CMP pressure, CMP edge velocity, CMP pad selection, and CMP time are key factors. We have experimentally determined that metal line protrusion height after differential planarization optimizing slurry selection, pressure, edge velocity, and pad selection is particularly correlated with surrounding intermetal gap dimension. Referring to FIG. 4, for example, the relationship between metal layer protrusion height and intermetal gap space is depicted for a structure similar to that of FIGS. 2B and 2C, wherein the subject surface comprises continuous (140) copper metal layers (102–105) and a silicon dioxide substrate layer (100), and is differentially planarized with a slurry comprising silica abrasive particles sized for the particular application, for a period of about 240 seconds.

For this and many other combinations of substrate and metal line materials, the slurry preferably has a maximum particle size less than about 5% of the adjacent intermetal gap dimension to provide protrusion height differentiation. For example, with intermetal gaps less than about 6 microns, a silica-based slurry having particle sizes between about 40 nanometers and about 70 nanometers is preferred. One reason for this relative sizing relationship is that smaller particles have better access to very narrow trenchlike features, and for this reason, silica-based slurries wherein the silica particles are formed by precipitation rather than fuming is preferred, due to the tendency of fumed silica particles to agglomerate, thereby forming the equivalents of larger silica particles. Further, the slurry preferably is pH adjusted to between about 9 and about 11 for maximum effectiveness in the presence of copper metal layers, and preferably has a low viscosity, on the order of water, of between about 1 and about 4 centipoise. Slurries having pH levels between about 7 and about 9 also are effective with copper, although relative selectivity rates for etching substrate material versus metal may result in some erosion of the copper metal as the substrate levels are also decreased. Preferred slurries comprise silica particles, de-ionized water, and any pH adjusting ingredients, such as sodium hydroxide. Other suitable slurries may have similar ingredients with the exception of a different abrasive, such as alumina, and copper corrosion inhibitors to modulate the copper corrosion and polishing rates relative to the substrate materials.

CMP pad selection is another key factor, and most preferred for small intermetal gap dimensions less than about 6 microns are polyurethane pads having compliant, soft, fiber-like compositions well suited for contacting low-laying surfaces under CMP conditions. Particularly preferred are the polyurethane pads sold under the trade names, "Politex Supreme™" and "IC1000™" by Rodel Corporation. Other commercially available pads may be modified to function similarly, using techniques known to those skilled in the art. Conventional CMP machinery, such as those sold under the trade names, "Mirra™" and "Reflexion™" by Applied Materials Corporation, and that sold under the trade name "NPS3301™", by Nikon Corporation.

Figure 5:
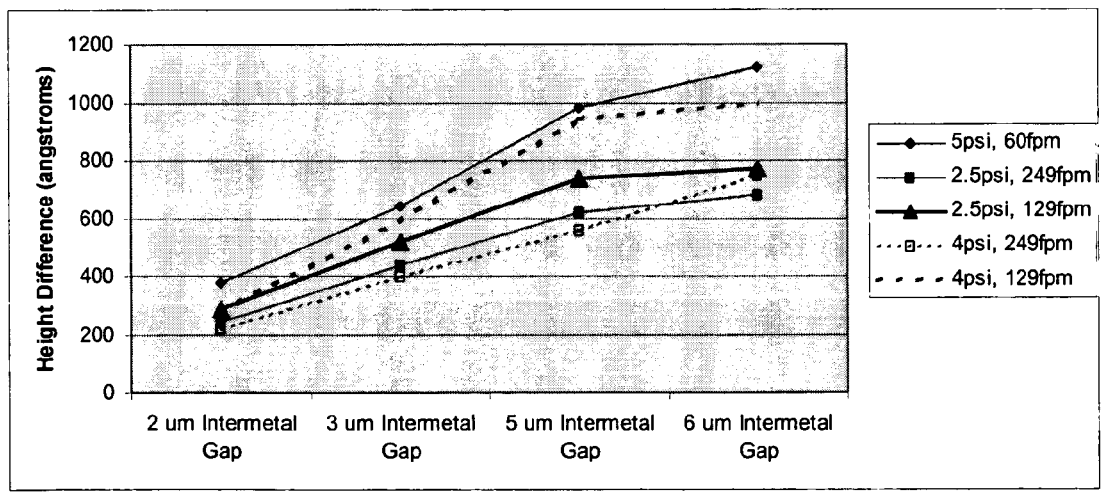
FIG. 5 depicts a chart illustrating metal layer height difference versus intermetal gap spacing in accordance with one embodiment of the present invention.

Referring to FIG. 5, the effect of CMP pressure and CMP edge velocity is illustrated using the same slurry and other conditions as in the embodiment for which data is depicted in FIG. 4. As shown in FIG. 5, increasing pressure and decreasing edge velocity can have significant effects on differential planarization at a given intermetal gap dimension. For example, in the preferred embodiment depicted in FIG. 4, a relatively high pressure of about 5 pounds per square inch ("psi"), and a relatively low edge velocity of about 60 feet per minute ("fpm"), provides a protrusion height of about 1,100 angstroms with an intermetal gap distance of around 6 microns, while a relatively low pressure of about 2.5 psi, and a relatively high edge velocity of about 250 feet per minute provides a protrusion height of about 700 angstroms with the same intermetal gap distance of about 6 microns. Preferably, the CMP pressure is between about 2.5 psi and about 6 psi. As noted above, CMP time is also a key factor. The data depicted in FIGS. 4 and 5 reflect about 240 seconds of CMP time, at which the increase in depth trails off asymptotically for the selected copper and silicon dioxide materials. Such asymptotic trailing off may be the result of the small CMP pad fibers being unable to adequately cause abrasion after a certain depth down in a very narrow trench. Until the asymptotic trailing off near the maximum protrusion height difference, differential planarization under the prescribed conditions progresses fairly linearly with time, and therefore CMP time may be used in conjunction with data such as that depicted in FIG. 5 to achieve less than maximum protrusion heights for various sets of conditions, as would be apparent to one skilled in the art. For example, referring to FIG. 4, a protrusion height of less than 200 angstroms, for an intermetal gap of about 2 microns may be achieved by decreasing the CMP time below the 240 seconds associated with the data of FIG. 4, to a CMP time such as about 120 seconds. Such techniques may be utilized to achieve predictable protrusion heights as low as 50 angstroms, lower than which tolerances may be unpredictable due to systematic variability associated with conventional CMP. Differential planarization is equally effective for intermetal gap distances exceeding 6 microns. For example, structures such as those depicted in FIGS. 2A–2D having intermetal gap distances between about 6 microns and about 10 microns may be effectively differentially planarized using the aforementioned techniques, with the exception that a slurry of larger particle size, preferably less than about 5% of the pertinent intermetal gap distance, may be effectively utilized.

Figure 3A:
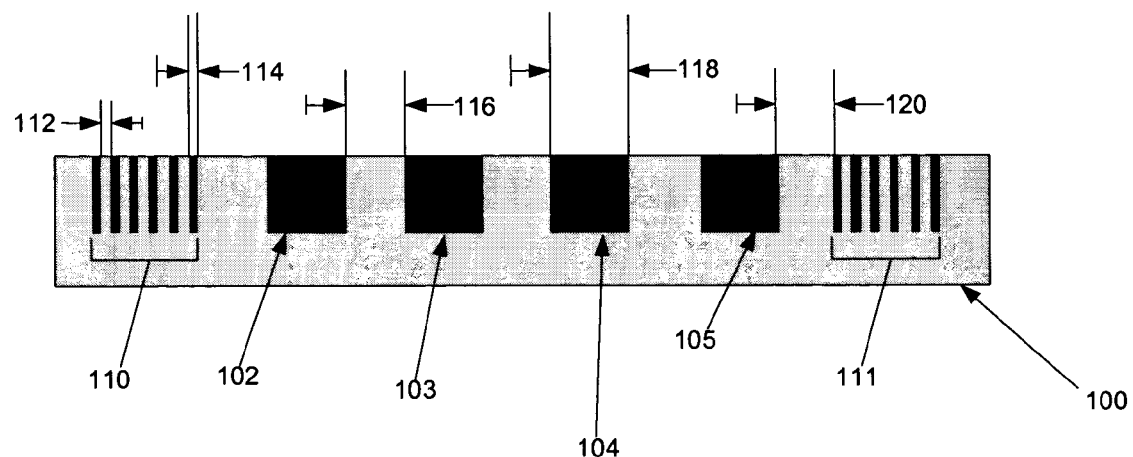
FIG. 3A depicts a cross-sectional view of a microelectronic structure having a substantially planar surface formed across a substrate layer that is coupled to a series of metal layers.
Figure 3B:
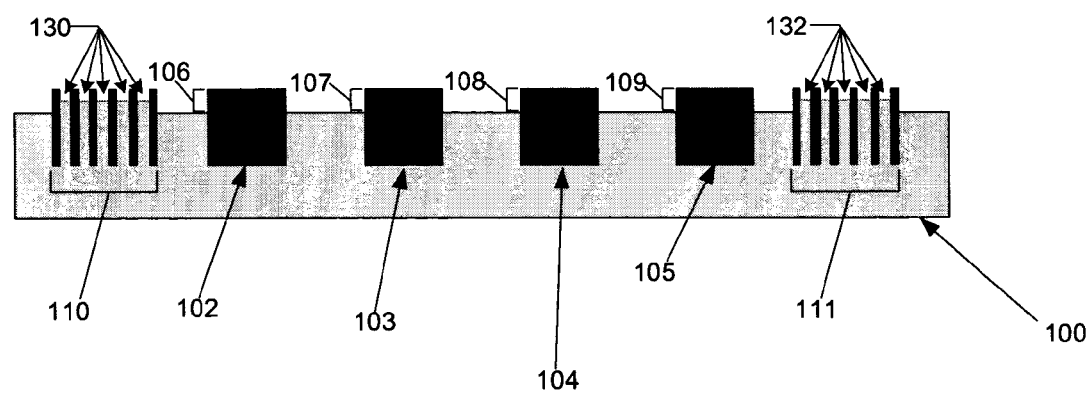
FIG. 3B depicts a cross-sectional view of various aspects of another embodiment of the present invention wherein differential planarization is utilized to form a nonplanar surface.

Referring to FIGS. 3A and 3B, another variation of the present invention is illustrated, wherein portions of a substrate are associated with metal layers having relatively narrow intermetal gaps, while other portions of the substrate are associated with metal layers having larger intermetal gaps. The transformation from a structure such as that depicted in FIG. 3A, to one such as that depicted in FIG. 3B illustrates the applicability of the present invention to predictably form a surface wherein certain groups of metal layers protrude farther from adjacent substrate material than do other metal layers comprising the same surface, in effect producing several different levels or echelons of substrate height relative to the height of the pertinent metal layers. In other words, differentially planarizing the substantially planar surface of the structure of FIG. 3A to decrease the level of the substrate (100) relative to the level of the metal layers (102–105, 110, 111) may result in a structure such as that depicted in FIG. 3B.

Referring to FIG. 3A, a substrate layer (100) is depicted which preferably is similar to that described in reference to FIG. 1A or 2A. The metal layers (102–105, 110, 111) preferably comprise copper, but may also comprise another metal or alloy, as described above. In one embodiment, for example, the larger metal layers (102–105) each have a width (118) of about 6 microns, and intermetal gap dimensions (116, 120) of about 4 microns, while the smaller metal layers comprising the two series (110, 111) each have a width (114) of about 2 microns and an intermetal gap dimension (112) of about 1 micron. A structure such as that depicted in FIG. 3A having these dimensions may be formed using the techniques described in reference to FIG. 2A.

To form a structure similar to that depicted in FIG. 3B, which has two groupings of protrusion heights—one associated with the larger metal layers (102–105) and larger intermetal gaps (116, 120), and one associated with the two series (110, 111) of smaller metal layers and their smaller intermetal gaps (112), differential planarization may be utilized. Since the intermetal gaps vary from about 1 micron to about 4 microns, and a preferred silica-based slurry has precipitated particles of size less than about 5% of the intermetal gap, a silica-based slurry having precipitated particles sized less than about 70 nanometers is effective. Utilizing, for example, a Politex™ supreme pad, a precipitated silica-based slurry with particle size less than about 70 nanometers and a pH of between about 9 and about 11, a viscosity between about 1 and about 4 centipoise, a CMP pressure of about 5 psi, and a CMP edge velocity of about 60 feet per minute, a structure similar to that of FIG. 3B will result, having protrusion heights (130, 132) for the smaller metal layers within the depicted series (110, 111) of about 200 angstroms, and protrusion heights (106–109) for the larger metal layers (102–105) of about 800 angstroms.

Thus, a novel surface modification solution is disclosed. Although the invention is described herein with reference to specific embodiments, many modifications therein will readily occur to those of ordinary skill in the art. Accordingly, all such variations and modifications are included within the intended scope of the invention as defined by the following claims.

The invention claimed is:

1. A microelectronic structure comprising:
a substrate layer coupled with a series of metal layers which form a surface of alternating metal layers and intermetal substrate gaps, each of the metal layers extending beyond the level of the intermetal substrate gaps around it by a protrusion height less than about 1,200 anstroms which is a function of the adjacent intermetal substrate gap dimensions, the protrusion height being formed by differential planarization;
wherein the series of metal layers includes a first metal layer and a second metal layer separated by a first width, there being no metal layer between portions of the first and second metal layers that extend beyond the level of the intermetal substrate gaps around them;
wherein the series of metal layers includes a third metal layer and a fourth metal layer separated by a second width smaller than the first width, there being no metal layer between portions of the third and fourth metal layers that extend beyond the level of the intermetal substrate gaps around them;
wherein the first and second metal layers extend beyond a first intermetal substrate gap between the first and second metal layers by a first protrusion height; and
wherein the third and fourth metal layers extend beyond a second intermetal substrate gap between the third and fourth metal layers by a second protrusion height smaller than the first protrusion height.

2. The microelectronic structure of claim 1 wherein a metal layer between intermetal substrate gaps of about 6 microns has a protrusion height of about 1,150 angstroms.

3. The microelectronic structure of claim 1 wherein a metal layer between intermetal substrate gaps of about 5 microns has a protrusion height of about 1,000 angstroms.

4. The microelectronic structure of claim 1 wherein a metal layer between intermetal substrate gaps of about 3 microns has a protrusion height of about 650 angstroms.

5. The microelectronic structure of claim 1 wherein a metal layer between intermetal substrate gaps of about 2 microns has a protrusion height of about 400 angstroms.

6. The microelectronic structure of claim 1 comprising a first series of metal layers having widths of about 6 microns and being surrounded by intermetal gaps of about 4 microns, wherein the protrusion heights are about 800 angstroms.

7. The microelectronic structure of claim 6 further comprising a second series of metal layers protruding from the same substrate, the second series having widths of about 2 microns and being surrounded by intermetal gaps of about 1 micron, wherein the protrusion heights are about 200 angstroms for the second series.

8. The microelectronic structure of claim 7 wherein differential planarization comprises chemical mechanical planarization with a silica-based abrasive having a particle size less than about 70 nanometers.

9. The microelectronic structure of claim 1 wherein the relative heights of the first and second protrusion heights are correlated to the relative widths of the first and second widths.

* * * * *